(12) United States Patent
Llewellyn

(10) Patent No.: US 6,785,392 B1
(45) Date of Patent: Aug. 31, 2004

(54) METHODS AND APPARATUS FOR ENABLING OR DISABLING AN AMPLIFIER

(75) Inventor: William D. Llewellyn, San Jose, CA (US)

(73) Assignee: Tripath Technology, Inc., Santa Clara, CA (US)

( * ) Notice: Subject to any disclaimer, the term of this patent is extended or adjusted under 35 U.S.C. 154(b) by 538 days.

(21) Appl. No.: 09/759,044

(22) Filed: Jan. 11, 2001

Related U.S. Application Data

(60) Provisional application No. 60/199,621, filed on Apr. 25, 2000.

(51) Int. Cl.[7] ............................................... H03E 21/00
(52) U.S. Cl. ........................... 381/120; 381/321; 330/51
(58) Field of Search ................................ 381/120, 121, 381/104, 107, 108, 102, 57, 320, 321, 94.5; 330/51; 327/562, 563

(56) References Cited

FOREIGN PATENT DOCUMENTS

| JP | 354091037 A | * | 7/1979 | ............ H03G/3/20 |
| JP | 402017480 A | * | 1/1990 | ............ G01S/3/58 |
| JP | 362062664 A | * | 3/1997 | ............ H04N/1/40 |
| JP | 409321560 A | * | 12/1997 | ............ H03G/3/30 |

* cited by examiner

Primary Examiner—Melur Ramakrishnaiah
(74) Attorney, Agent, or Firm—Beyer Weaver & Thomas, LLP

(57) ABSTRACT

Apparatus and methods for enabling and disabling an amplifier is described. Amplifiers can be enabled and disabled for the sake of power and energy savings and reduction of dissipated heat. The circuit is based on a gain stage and threshold circuitry. A signal associated with an amplifier is introduced into the gain stage. The gain stage amplifies the signal level and provides the amplified signal level to threshold circuitry. The threshold circuitry references the amplified signal level and determines signal states. The control circuitry interprets these signal states to determine when to enable or disable an amplifier. The output of the threshold circuitry can be used to adjust the amplified signal level to oppose drift in the gain stage.

44 Claims, 4 Drawing Sheets

METHODS AND APPARATUS FOR ENABLING OR DISABLING AN AMPLIFIER

RELATED APPLICATION DATA

The present application claims priority from U.S. Provisional Patent Application No. 60/199,621 for MUTE-IN-SILENCE SCHEME FOR AUDIO AMPLIFIERS filed on Apr. 25, 2000, the entirety of which is incorporated herein by reference for all purposes.

BACKGROUND OF THE INVENTION

The present invention relates to apparatus and methods for qualifying signal levels. More specifically, the present invention provides apparatus and methods for enabling and disabling an amplifier based on input signal levels. Still more specifically, the present invention provides apparatus and methods for comparing an amplified input signal to threshold levels in order to determine whether to enable or disable an amplifier.

Many applications require the referencing of input signals. Input signals can be compared to particular thresholds and the results of these comparisons can be used to determine output signals. In one particular situation, input signals can be referenced to determine whether to enable or disable an amplifier. When input signals are sufficiently small, for example, an amplifier can be disabled to save power and limit heat dissipation.

Small input signals require amplification prior to referencing by conventional comparators. The addition of a stage of amplification, however, adds noise, distortion, offset, drift, and possibly other undesirable effects. Typical workarounds include the use of common-centroid layouts and differential pairs. Components with identical electrical and thermal properties can be wired symmetrically such that drafts and linear gradients arising during their operation cancel. Such fluctuations in their characteristics are fully compensated by their symmetrical components. Common-centroid layouts are effective in reducing noise and thermal drift. However, long-term drift and non-linear gradients remain significant problems.

The chopper technique is another workaround used to limit undesirable amplification effects. DC signals are converted into periodic signals at a known frequency. The periodic signals are amplified and subsequently demodulated by multiplying the amplified signal with the signal used to initially convert the signal into a periodic one. This technique provides for low long-term drift. However, as signal frequencies approach the clock frequency, the chopper amplifier can introduce aliasing. Chopper amplifier systems thus have typically been limited to low frequency applications. Chopper amplifiers also tend not only to be more expensive than traditional precision amplifiers, but they can also introduce substantial noise in the form of large ripple voltages resulting from voltage swings at the predetermined clock intervals.

A variation on chopper amplifier is the chopper-stabilized amplifier. Two operational amplifiers are placed on a chip, along with offset-error storage capacitors. The main operational amplifier functions as a conventional amplifier. The nulling operational amplifier monitors the input offset of the main operational amplifier. Operation functions in alternating stages. In the first stage of operation, the nulling operational amplifiers inputs are shorted and the amplified feedback is used to eliminated offset error of the nulling operational amplifier. In the second stage of operation, the inputs of the nulling operational amplifier are connected to the inputs of the main operational amplifier so that the main operational amplifier now has zero offset. However, the chopper-stabilized amplifier is susceptible to significant amounts of digital switching noise as it cycles between stages of operation.

It is therefore desirable to provide improved techniques and systems for enabling or disabling an amplifier based on referenced input signals.

SUMMARY OF THE INVENTION

According to the present invention, methods and apparatus are provided for qualifying signal levels. Mechanisms are provided for enabling and disabling an amplifier based on a determination of the input signal level. The amplifier can be disabled primarily for saving energy and reducing heat dissipation. In one particular implementation, input signals from multiple channels in a variety of possible configurations can be amplified using a conventional gain stage. The amplified signal can then be compared with threshold voltages using threshold circuitry. Depending on the output of the threshold circuitry operations, the detector circuit may send an enable or disable signal to the amplifier. The output of the threshold circuitry can also adjust the amplified signal level to oppose drift in the gain stage.

One aspect of the invention provides apparatus for enabling and disabling an amplifier that has an associated signal level. The circuit can be characterized by the following features: (1) a gain stage for amplifying the signal level and generating an amplified signal level; (2) threshold circuitry for comparing the amplified signal level to a plurality of thresholds and indicating a signal level state representative of the amplified signal level; and (3) control circuitry for enabling and disabling the amplifier in response to the signal level state, the control circuitry comprising adjustment circuitry coupled between the threshold circuitry and the gain stage for introducing discrete signal level adjustments to the amplified signal level in opposition to a change in the amplified signal level indicated by a corresponding change in the signal level state, thereby opposing drift in the amplified signal level.

The control circuitry may be used to determine whether to adjust the discrete value. In one embodiment of this invention, breaches of the same threshold detector must occur on consecutive clock cycles before the discrete value is changed. In one example, the discrete value may be converted into an analog signal level adjustment using a digital to analog converter.

Another aspect of the invention provides apparatus for enabling and disabling an amplifier that has an associated signal level. The circuit can be characterized by the following features: (1) a gain stage for amplifying the signal level and generating an amplified signal level; (2) threshold circuitry for comparing the amplified signal level to a plurality of thresholds and indicating a signal level state representative of the amplified signal level; and (3) control circuitry for enabling and disabling the amplifier in response to the signal level state, the control circuitry comprising adjustment circuitry coupled between the threshold circuitry and the gain stage for introducing signal level adjustments in opposition to a change in the amplified signal level indicated by a corresponding change in the signal level state, thereby preventing enabling of the amplifier by the control circuitry where the change in the signal level state is reversed by the introduction of signal level adjustments.

Yet another aspect of the invention provides apparatus for enabling and disabling an amplifier that has an associated signal level. The circuit can be characterized by the following features: (1) a gain stage for amplifying the signal level and generating an amplified signal level; (2) threshold circuitry for comparing the amplified signal level to a plurality of thresholds and indicating a signal level state representative of the amplified signal level, the plurality of thresholds comprising a first threshold corresponding to a first value of the amplified signal level, and a second threshold corresponding to a second value of the amplified signal level greater than the first value; and (3) control circuitry for enabling and disabling the amplifier in response to the signal level state, the control circuitry comprising qualification circuitry for qualifying enablement of the amplifier where the amplified signal level is between the first and second values, the control circuitry being operable to enable the amplifier without regard to the qualification circuitry where the amplified signal level exceeds the second value.

Another aspect of the invention provides apparatus for enabling and disabling an amplifier that has an associated signal level. The circuit can be characterized by the following features: (1) a gain stage for amplifying the signal level and generating an amplified signal level; (2) threshold circuitry for comparing the amplified signal level to a plurality of thresholds and indicating a signal level state representative of the amplified signal level; and (3) control circuitry for enabling and disabling the amplifier in response to the signal level state, the control circuitry comprising adjustment circuitry coupled between the threshold circuitry and the gain stage for introducing signal level adjustments in opposition to a change in the amplified signal level indicated by a corresponding change in the signal level state, and stabilization circuitry for preventing further introduction of signal level adjustments for a predetermined period of time following the introduction of a first signal level adjustment to thereby allow settling of the gain stage.

Another aspect of the invention provides apparatus for enabling and disabling an amplifier that has an associated signal level. The circuit can be characterized by the following features: (1) a gain stage for amplifying the signal level and generating an amplified signal level; (2) threshold circuitry for comparing the amplified signal level to a plurality of thresholds and indicating a signal level state representative of the amplified signal level; and (3) control circuitry for enabling and disabling the amplifier in response to the signal level state, the control circuitry comprising stabilization circuitry for preventing enabling of the amplifier for a predetermined period of time following disabling of the amplifier regardless of the amplified signal level.

Still another aspect of the invention provides apparatus for enabling and disabling an amplifier that has an associated signal level. The circuit can be characterized by the following features: (1) a buffering stage for combining the first and second signal levels to generate a combined signal level, unequal gains being applied to the first and second signal levels to generate the combined signal level; and (2) threshold circuitry for determining whether the combined signal level exceeds predetermined threshold levels and indicating a signal level state for enabling or disabling an amplifier.

A further understanding of the nature and advantages of the present invention may be realized by reference to the remaining portions of the specification and the drawings.

DESCRIPTION OF SPECIFIC EMBODIMENTS

Figure 1:
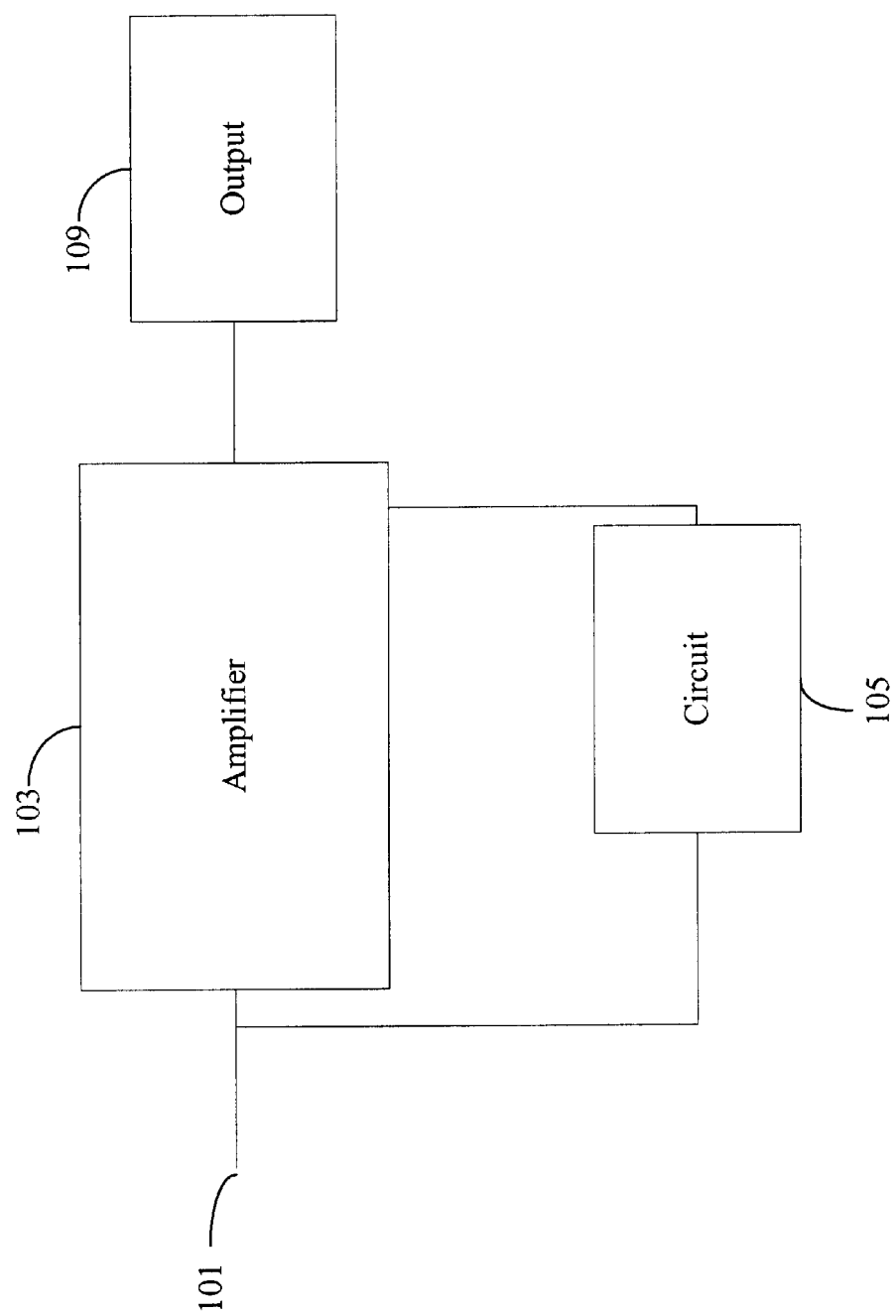
FIG. 1 is a block diagram showing one possible configuration that may be used to connect the circuit of the present invention with an amplifier.

FIG. 1 is a block diagram of one example of a system in which the present invention may be applicable. An input signal at 101 with an associated signal level is received by both amplifier 103 and the circuit 105 of the present invention. In one embodiment of the invention, the circuit 105 for enabling and disabling the amplifier may be integrated into the amplifier 103 itself. The circuit 105 interprets the input signal level 101 and determines whether to send a signal to the enable or disable the amplifier 103. If the amplifier 103 is enabled, the amplifier 103 modifies the input signal at 101 and sends the modified signal to output 109.

Figure 2:
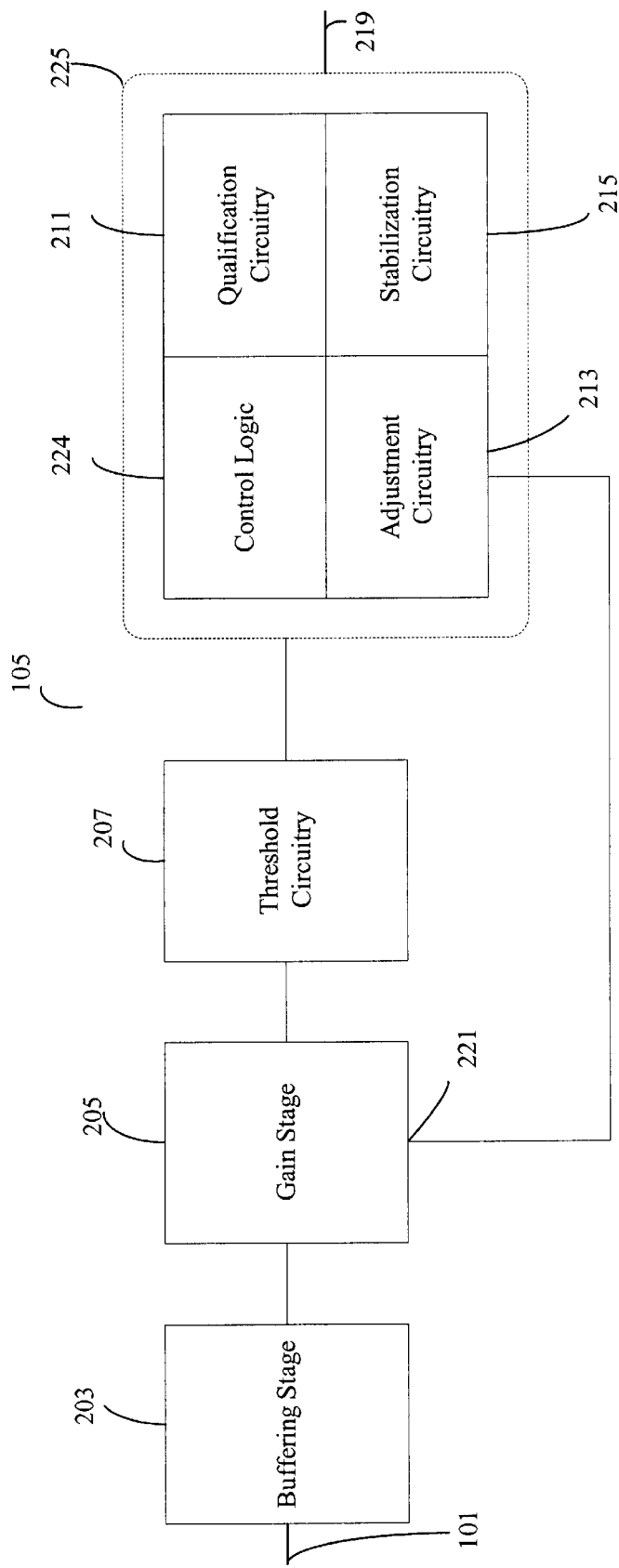
FIG. 2 is a block diagram of the present invention according to specific embodiments.

FIG. 2 is a block diagram of the present invention according to specific embodiments. A signal level is received at 101 by buffering stage 203. Buffering stage 203 can combine multiple signals, apply different gains to a plurality of signals, or simply buffer the signal prior to introducing the signal into gain stage 205. The gain stage 205 amplifies the signal which threshold circuitry 207 receives. The threshold circuitry 207 can comprise a plurality of comparators for referencing the amplified signal level and presenting a signal level state to the control circuitry 225. Control logic 224 of control circuitry 225 processes referenced signal levels. In one embodiment of the present invention, the control logic 224 identifies the signal level states. Some of these signal level states may be ignored by qualification circuitry 211. The stabilization circuitry 215 may require that signal level states be ignored for a predetermined period of time. Other signal level states may indicate that the amplifier should be enabled or disabled by sending a signal to output 219. Control circuitry 225 and threshold circuitry 207 remain enabled even when a signal has been sent to output 219 to disable the amplifier. Still other signal level states may be used by the adjustment circuitry 213 to adjust the amplified signal level at 221.

It should be noted that the present invention can be practiced with additional circuitry or with stages removed. For example, the buffering stage may not be necessary in one embodiment. Alternatively, the buffering stage 203 and the gain stage 205 in one embodiment may be a single stage represented by one operational amplifier. Furthermore, the location of each stage or the coupling of the circuitry may be varied while remaining within the scope of the present invention. For example, the threshold circuitry 207 may partially reside in the buffering stage 204 or in the gain stage 205. The threshold circuitry 207 may also transmit signals directly to output 219, instead of introducing the signal into control circuitry 225. Node 221, where the adjustment circuitry 213 introduces a signal, may also lie at various points along the gain 205 or buffering stages 203, or within the threshold circuitry 207 itself. Variations fall within the scope of the present invention.

Figure 3:
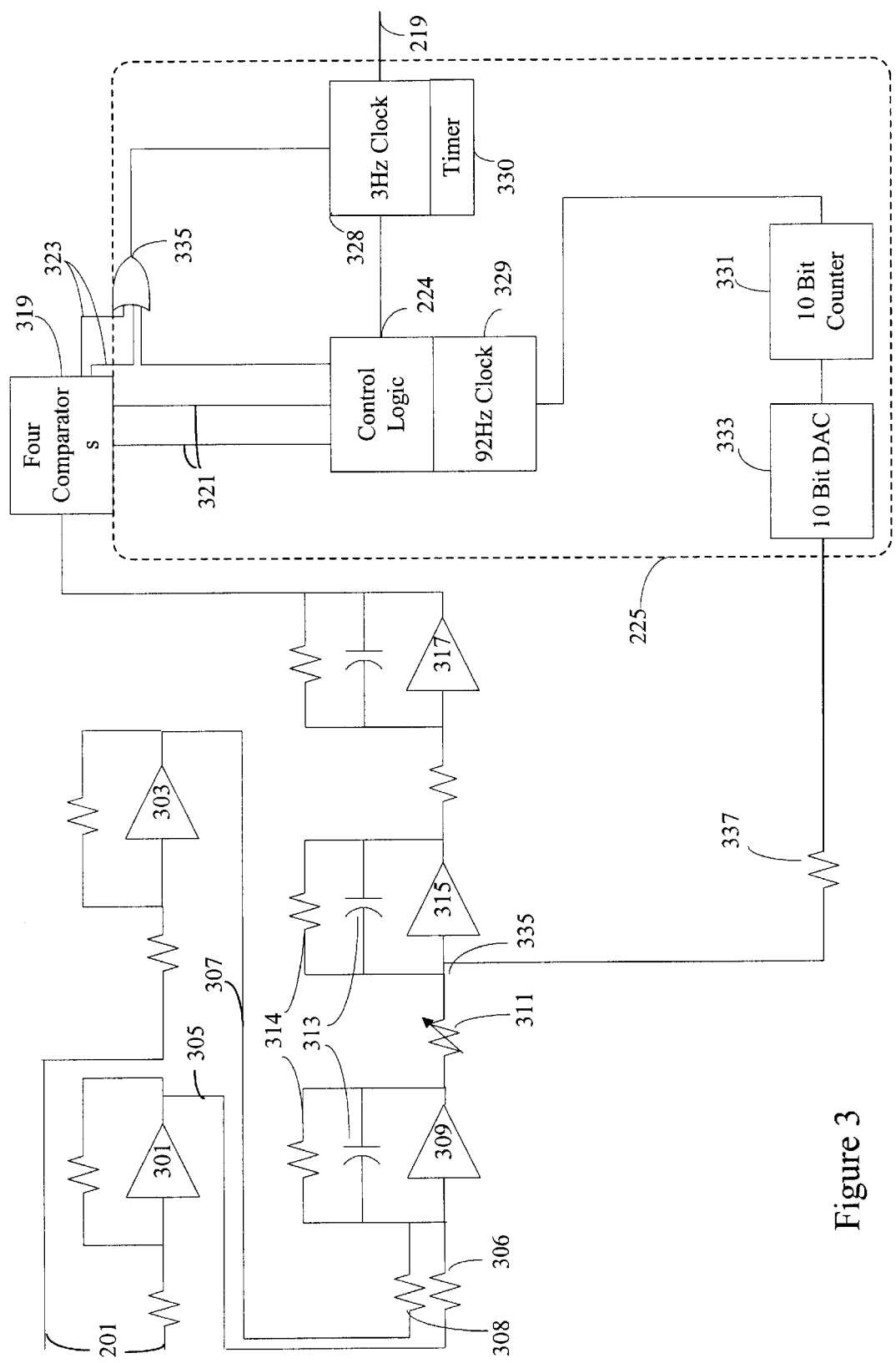
FIG. 3 is a schematic diagram of present invention designed according to specific embodiments of the invention.

FIG. 3 is a simplified schematic of a circuit according to specific embodiments of the present invention for enabling and disabling an amplifier. Operational amplifiers 301 and 303 buffer signals to generate input signal levels on channels 305 and 307. The present invention will work with a variety of channel configurations. Multiple channels or a single channel can be used with the circuit for enabling and disabling an amplifier. In a system where two channels 305 and 307 are used, different gains may be applied to each channel. These different gains may be applied by adjusting the values of the resistors 306 and 308 or by adjusting the value of the resistors associated with the buffering amplifiers 301 and 303.

Different gains can be applied to the input signal levels to accommodate bridged-monaural use of a 2-channel, stereo audio amplifier. In bridged-monaural mode, the amplifier's left and right inputs are typically exactly equal and of opposite phase. The positive terminals at the left and right amplifier outputs are connected to the positive and negative terminals, respectively, of a speaker load.

This gives maximum power output by doubling the voltage at the load and quadrupling the delivered power, although only in monaural configuration. Since the left and right inputs are typically equal and of opposite phase, summing the inputs would cancel the two signals. A typical attempt to introduce the summed signal into a detector circuit would result in the detector circuit identifying constant "silence."

In one embodiment of the invention, 6 dB more gain is introduced into one channel by varying the resistor values 306 and 308 or by varying the gain associated with amplifiers 301 and 303. This 6 dB difference allows the circuit to detect the presence of a signal when the signal levels of the channels would have cancelled. The 6 dB difference between channels is insignificant in other channel configurations for the purpose of identifying silence. In stereo configuration, both channels are generally highly correlated with similar program material. In one embodiment of the present invention, 6 dB is a small differential with respect to a −60 dB to −80 dB threshold typically employed for disabling an amplifier.

The combined signal level can be amplified using a variety of components. According to specific embodiments, a series of operational amplifiers 309, 315, and 317 are used. The signal, combined at operational amplifiers 309, can be low pass filtered with a rolloff at 85 kHz. The low pass filter formed by the inclusion of capacitor 313 for each amplifier is optional, but it can have the effect of making the gain stage more immune to out-of-band noise. Resistors 314 can have a value of 188 k. Differential signals can be maintained for general noise immunity throughout the amplifier chain. The gain stage can include a variable resistor 311 to adjust the gain applied to the signal level. Adjusting the gain applied to the signal level can effectively vary the signal level at which the circuit will enable or disable an amplifier. It should be noted that a variety of gain stage components can be used. In one embodiment of the invention, multiple operational amplifiers for each channel can be used each with a variable resistor to further control determination of when to enable or disable an amplifier.

Operational amplifiers 309, 315, and 317 can apply a gain on the order of 60 dB to 65 dB to the signal level with a 20 kHz bandwidth. This amplified signal level can then be introduced into threshold circuitry so that the signal level can be referenced. The threshold circuitry can comprise components such as conventional comparators or general-purpose operational amplifiers used as comparators. The results of the qualifications are signal level states used to determine whether the amplifier should be enabled or disabled. Examples of signal level states can include qualified enable, disable, and immediately enable states. In one embodiment of the invention, two voltage comparators reference the amplified signal level and provide three possible signal level states. The three states can be the following: above an upper threshold, between the two thresholds, and below a lower threshold. These signal level states may be transmitted to control circuitry 225 comprising control logic 224 for further processing, or the signal level states can be used to immediately enable or disable an amplifier.

According to specific embodiments, four voltage comparators are used to reference the amplified signal level. Two inner threshold detectors 321 are bounded by two outer threshold detectors 323. The inner threshold detectors 321 have thresholds 0.6V and 1.6V while the outer threshold detectors have values 0.2V and 2.0V.

If the amplified signal level triggers either one of the outer threshold detectors 323, a signal level state indicating this condition is sent to stabilization circuitry to determine if the amplifier should be enabled. Alternatively, an enable signal may be sent to the amplifier immediately.

The stabilization circuitry may prevent any enable signal from being transmitted to the amplifier for a period of time after a disable signal has been transmitted. According to specific embodiments, the stabilization circuitry comprises an OR gate 335 coupled with a timer 328. The timer 328 is a 3-bit shift register clocked at 3 Hz. The 3-bit shift registered clocked by a 3 Hz clock can prevent the control circuitry 225 from considering any signal level states for 3 periods of the 3 Hz clock, equivalent to one second, after an amplifier disable event. The delay in sending an enable allows the gain stage to stabilize, as an amplifier disable event may have caused a signal level disturbance in the gain stage.

A timer 330 can be used prevent an enabled amplifier from being disabled after a momentary signal lapse. According to specific embodiments, the timer 330 runs whenever the signal level state indicates that the amplifier should be disabled but the amplifier is in its enabled state. If the timer 330 reaches a predetermined value, typically 3–12 minutes, a disable signal is transmitted to the amplifier. If the timer 330 has not reached a predetermined value and the signal level state corresponds to an amplifier enable state, the timer 330 is reinitialized. The timer 330 prevents the control circuitry 225 from disabling the amplifier immediately upon receiving a disable signal level state.

If the amplified signal level triggers either one of the inner threshold detectors 321, a signal level state indicating this condition is sent to stabilization circuitry to determine if the amplifier should be enabled and also to adjustment circuitry to oppose drift in the gain stage.

According to specific embodiments, the adjustment circuitry comprises counter 331 and a digital to analog converter 333. The counter 331 and the digital to analog converter 333 are both 10 bits in length. A signal level state indicating that the amplified signal level is above 1.6V would cause the adjustment circuitry to decrement the counter 331. Where the signal level state indicates that the amplified signal level is below 0.6V, the counter 331 would be incremented. A digital to analog converter 333 takes the value of counter 331 and converts the value into a signal level. This signal level is fed through a resistor 337 back into the gain stage at node 335. This signal level can also be fed through a resistor into other circuit nodes. In one embodiment of the invention, each counter value step changes the amplified signal level by approximately 200 mV. The signal level fed through a resistor 337 can drive the amplified signal level back between the threshold values of 0.6V and 1.6V. Since the displacement between the two threshold values is 1V, a signal of 800 mV peak-to-peak can be present without exceeding the threshold values.

The adjustment circuitry can further comprise a clock 329 and latches. A signal level state indicating that the amplified signal level is above 1.6V would cause the adjustment circuitry to set a first latch. Where the signal level state indicates that the amplified signal level is below 0.6V, the second latch would be set. In one embodiment, latches would be polled at a frequency of 92 Hz. If the first latch was set, the adjustment circuitry decrements the counter by one step and resets the first latch. If the second latch was set, the adjustment circuitry increments the counter by one step and resets the second latch. The digital to analog converter 333 takes the value of counter 331 and introduces a signal level corresponding to the value of the counter into the gain stage. As stated above, this can have the effect of driving the amplified signal level back between the threshold levels whenever either threshold is crossed. A delay in which both latches are held cleared immediately following the change in counter value can be used to allow the digital to analog converter and the gain stage to settle. This delay can be introduced by the control circuitry's stabilization circuitry. In one embodiment of the invention, an 83 us delay is used. In the cases where neither or both latches had been set, no counter changes occur. Both latches are set when the amplified signal strength at the input of comparators 319 is sufficient to traverse both thresholds 321 in a continuous manner, representing a condition where the amplifier should not be disabled. Under such a condition, action by the loop formed by operational amplifiers 315 and 317, comparators 319, control logic 224, 92 Hz clock 329, 10-bit counter 331, and 10-bit digital to analog converter—which ordinarily works to maintain the DC bias (average value) of the voltage at the input of comparators 319 bounded within thresholds 321—is unnecessary.

The adjustment circuitry opposes drift in the gain stage. However, the amplified signal level may still occasionally exceed predetermined threshold levels. According to specific embodiments, the control circuitry 225 can send a signal to enable the amplifier whenever the signal level state indicates that the amplified signal level has exceeded a threshold level. Alternatively, the control circuitry may wait a predetermined period of time to verify that the signal level state is still indicating that the amplified signal level is exceeding an inner threshold level. The control circuitry may only send an enable signal to the amplifier when the signal level state indicates that the amplified signal level is exceeding an inner threshold level on adjacent clock cycles. In one embodiment, the control circuitry can use clock 329 for a 92 Hz clock cycle. If the signal level state no longer indicates that the amplified signal level is exceeding the same threshold level on adjacent 92 Hz clock cycles, the control circuitry 225 can determine not to send an enable signal to the amplifier, allowing for stabilization of the gain stage following a 1-bit change in the digital to analog converter 333.

Likewise where the timer 328 runs whenever the signal level state is determined to show that the amplifier should be disabled, a single threshold crossing may not require that the timer be reset. The timer 328 may be allowed to run until either it reaches a predetermine value during which the amplifier is disabled, or threshold crossings occur on consecutive clock cycles.

Figure 4:
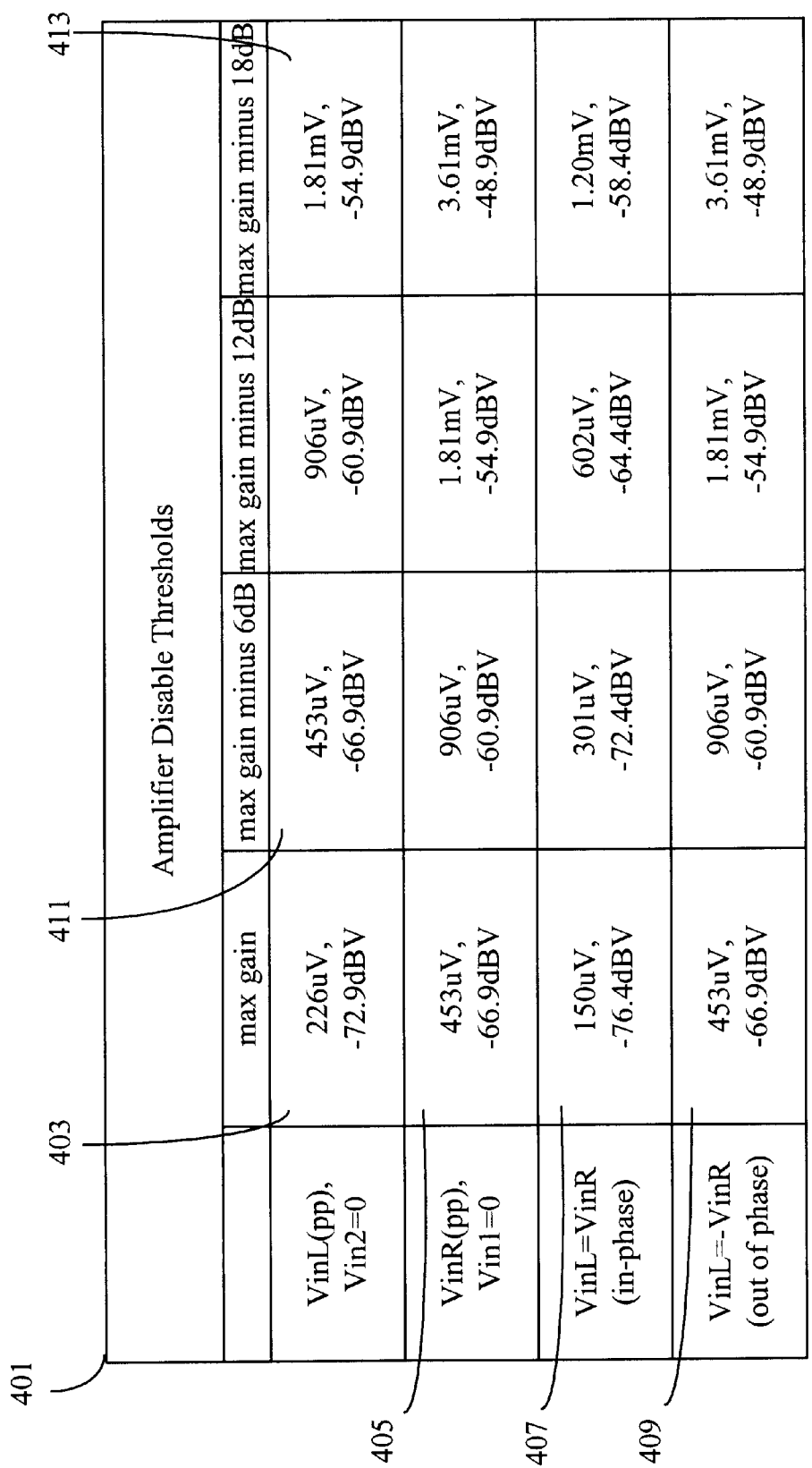
FIG. 4 is a table showing the amplifier disable thresholds at four different gain settings with different input conditions, according to specific embodiments.

FIG. 4 shows the amplifier disable thresholds at four different gain settings with varying input conditions. According to specific embodiments, the left channel has 6 dB more gain than the right channel. The gain stage can have four different gains, adjustable in steps of 6 dB. The gain can be adjusted by varying one or more resistor values associated with operational amplifiers in the gain stage. Comparator threshold values can be 1.6V for the upper threshold and 0.6V for the lower threshold. The columns in table 401 show the thresholds of silence detection for various gain settings and input signal amplitudes. The rows of table 401 input conditions where Vin2=0, Vin1=0, VinL=VinR, and VinL=−VinR. The table entries are referenced to 1V RMS differential analog input voltages (1V RMS=0 dBV).

According to specific embodiments, entry 403 shows the condition where Vin2=0 and the maximum gain is applied to an input signal level. More gain in the amount of 6 dB is applied to the left channel than to the right channel. An RMS VinL signal level of 226 uV would fall within the threshold values. Since less gain is applied to the right channel, a higher voltage, 453 uV at entry 405 would fall within the threshold values.

Entry 407 shows the input condition where VinR=VinL. A 150 uV signal on each channel would be amplified by the maximum gain would fall within the threshold values. In bridged-monaural application where VinL=−VinR, a 453 uV signal on the left channel and a −1.28 mV signal on the right channel after amplification would again fall between the lower threshold value of 0.6V and the upper threshold value of 1.6V.

Entry 411 shows the application of the maximum gain minus 6 dB to an input signal level. A 453 uV RMS signal level at VinL would fall within the threshold values after amplification, whereas a 453 uV RMS signal level at VinL would not where the input signal level were amplified by the maximum gain. The transition from an application of the maximum gain to 6 dB less than the maximum gain can effectively make the threshold circuitry less sensitive to input signal levels by reducing the gain applied to the input signal level. Furthering reducing the gain applied by another 12 dB at entry 413 would result in a VinL signal level of 1.81 mV falling within the threshold values.

While the invention has been particularly shown and described with reference to specific embodiments thereof, it will be understood by those skilled in the art that changes in the form and details of the disclosed embodiments may be made without departing from the spirit or scope of the invention. It should be noted that the components noted in the schematic shown in FIG. 3 can be used in different sequences without falling outside the scope of the present invention. For example, the outer threshold detectors 323 may be located immediately after the buffering stage or anywhere along the gain stage. OR gate 335 may be replaced with a variety of logic elements. The timer 338 and the clock 229 can be integrated into timing circuitry.

It will be understood that the embodiments of the invention described above with reference to FIGS. 1, 2, 3, and 4 may be implemented in a variety of ways. For example, discrete components may be used. Alternatively, each of the embodiments may be implemented in an integrated circuit using any of a wide variety of IC fabrication processes including, for example, CMOS and BiCMOS processes. For example, the embodiments described above may be implemented using discrete circuit elements as well as in integrated circuits. Moreover, embodiments of the present invention may be employed to determine the signal level of a wide variety of signal types and should not be restricted merely to the enabling and disabling of an amplifier. Therefore, the scope of the invention should be determined with reference to the appended claims.

What is claimed is:

1. A circuit for enabling and disabling an amplifier, the amplifier having a signal level associated therewith, the circuit comprising:

a gain stage for amplifying the signal level and generating an amplified signal level;

threshold circuitry for comparing the amplified signal level to a plurality of thresholds and indicating a signal level state representative of the amplified signal level; and control circuitry for enabling and disabling the amplifier in response to the signal level state, the control circuitry comprising adjustment circuitry coupled between the threshold circuitry and the gain stage for introducing discrete signal level adjustments to the amplified signal level in opposition to a change in the amplified signal level indicated by a corresponding change in the signal level state, thereby opposing drift in the amplified signal level, wherein the control circuitry further comprises qualification circuitry for qualifying enablement of the amplifier where the amplified signal level is between the first and second values, the control circuitry being operable to enable the amplifier without regard to the qualification circuitry where the amplified signal level exceeds the second value.

2. The circuit of claim 1, wherein the signal level adjustments are introduced into the gain stage.

3. The circuit of claim 1, wherein the adjustment circuitry comprises a digital to analog converter.

4. The circuit of claim 3, wherein the adjustment circuitry further comprises a counter.

5. The circuit of claim 4, wherein the digital to analog converter introduces a signal level adjustment into the gain stage corresponding to the value of the counter.

6. The circuit of claim 1, wherein adjustment circuitry is configured to prevent enabling of the amplifier by the control circuitry where the change in the signal level state is reversed by the introduction of a signal level adjustment.

7. The circuit of claim 6, wherein the plurality of thresholds comprises a first threshold corresponding to a first value of the amplified signal level, and a second threshold corresponding to a second value of the amplified signal level greater than the first value.

8. The circuit of claim 6, wherein the control circuitry further comprises stabilization circuitry for preventing further introduction of signal level adjustments for a predetermined period of time following the introduction of a first signal level adjustment to thereby allow settling of the gain stage.

9. The circuit of claim 1, wherein the plurality of thresholds comprises a first threshold corresponding to a first value of the amplified signal level, and a second threshold corresponding to a second value of the amplified signal level greater than the first value.

10. The circuit of claim 9, wherein the control circuitry further comprises qualification circuitry for qualifying enablement of the amplifier where the amplified signal level is between the first and second values, the control circuitry being operable to enable the amplifier without regard to the qualification circuitry where the amplified signal level exceeds the second value.

11. The circuit of claim 1, wherein the control circuitry further comprises stabilization circuitry for preventing further introduction of signal level adjustments for a predetermined period of time following the introduction of a first signal level adjustment to thereby allow settling of the gain stage.

12. The circuit of claim 1, wherein the control circuitry further comprises stabilization circuitry for preventing enabling of the amplifier for a predetermined period of time following disabling of the amplifier regardless of the amplified signal level.

13. A circuit for enabling and disabling an amplifier, the amplifier having a signal level associated therewith, the circuit comprising:

a gain stage for amplifying the signal level and generating an amplified signal level;

threshold circuitry for comparing the amplified signal level to a plurality of thresholds and indicating a signal level state representative of the amplified signal level;

control circuitry for enabling and disabling the amplifier in response to the signal level state, the control circuitry comprising adjustment circuitry coupled between the threshold circuitry and the gain stage for introducing signal level adjustments in opposition to a change in the amplified signal level indicated by a corresponding change in the signal level state, wherein adjustment circuitry is configured to prevent enabling of the amplifier by the control circuitry where the change in the signal level state is reversed by the introduction of a signal level adjustment;

a first input channel associated with a first input signal level;

a second input channel associated with a second input signal level; and a buffering stage for combining the first and second signal levels to generate a combined signal level, unequal gains being applied to the first and second signal levels to generate the combined signal level.

14. The circuit of claim 13, wherein the adjustment circuitry comprises a clock for measuring a period of time during which the adjustment circuitry is configured to prevent enabling of the amplifier.

15. The circuit of claim 13, wherein the control circuitry further comprises stabilization circuitry for preventing further introduction of signal level adjustments for a predetermined period of time following the introduction of a first signal level adjustment to thereby allow settling of the gain stage.

16. The circuit of claim 13, wherein the control circuitry further comprises stabilization circuitry for preventing enabling of the amplifier for a predetermined period of time following disabling of the amplifier regardless of the amplified signal level.

17. A circuit for enabling and disabling an amplifier, the amplifier having a signal level associated therewith, the circuit comprising:

a gain stage for amplifying the signal level and generating an amplified signal level;

threshold circuitry for comparing the amplified signal level to a plurality of thresholds and indicating a signal level state representative of the amplified signal level, the plurality of thresholds comprising a first threshold corresponding to a first value of the amplified signal level, and a second threshold corresponding to a second value of the amplified signal level greater than the first value; and control circuitry for enabling and disabling the amplifier in response to the signal level state, the control circuitry comprising qualification circuitry for qualifying enablement of the amplifier where the amplified signal level is between the first and second values, the control circuitry being operable to enable the amplifier without regard to the qualification circuitry where the amplified signal level exceeds the second value.

18. The circuit of 17, wherein the qualification circuitry prevents enabling the amplifier by the control circuitry where the amplified signal level is between the first and second values for less than a predetermined period of time.

19. The circuit of claim 17, wherein the control circuitry further comprises stabilization circuitry for preventing further introduction of signal level adjustments for a predetermined period of time following the introduction of a first signal level adjustment to thereby allow settling of the gain stage.

20. The circuit of claim 17, wherein the control circuitry further comprises stabilization circuitry for preventing enabling of the amplifier for a predetermined period of time following disabling of the amplifier regardless of the amplified signal level.

21. The circuit of claim 17 further comprising:
A first input channel associated with a first input signal level;
A second input channel associated with a second input signal level; and
A buffering stage for combining the first and second signal levels to generate a combined signal level, unequal gains being applied to the first and second signal levels to generate the combined signal level.

22. A circuit for enabling and disabling an amplifier, the amplifier having a signal level associated therewith, the circuit comprising:
a gain stage for amplifying the signal level and generating an amplified signal level;
threshold circuitry for comparing the amplified signal level to a plurality of thresholds and indicating a signal level state representative of the amplified signal level;
control circuitry for enabling and disabling the amplifier in response to the signal level state, the control circuitry comprising:
adjustment circuitry coupled between the threshold circuitry and the gain stage for introducing signal level adjustments in opposition to a change in the amplified signal level indicated by a corresponding change in the signal level state; and
stabilization circuitry configured to prevent further introduction of signal level adjustments for a predetermined period of time following the introduction of a first signal level adjustment to thereby allow settling of the gain stage;
a first input channel associated with a first input signal level;
a second input channel associated with a second input signal level; and
a buffering stage for combining the first and second signal levels to generate a combined signal level, unequal gains being applied to the first and second signal levels to generate the combined signal level.

23. The circuit of claim 22, wherein the stabilization circuitry comprises a clock for measuring the predetermined period of time.

24. The circuit of claim 22, wherein the stabilization circuitry is further configured to prevent enabling of the amplifier for a predetermined period of time following disabling of the amplifier regardless of the amplified signal level.

25. A circuit for enabling and disabling an amplifier, the amplifier having a signal level associated therewith, the circuit comprising:
a gain stage for amplifying the signal level and generating an amplified signal level;
threshold circuitry for comparing the amplified signal level to a plurality of thresholds and indicating a signal level state representative of the amplified signal level;
control circuitry for enabling and disabling the amplifier in response to the signal level state, the control circuitry comprising stabilization circuitry for preventing enabling of the amplifier for a predetermined period of time following disabling of the amplifier regardless of the amplified signal level;
a first input channel associated with a first input signal level;
a second input channel associated with a second input signal level; and
a buffering stage for combining the first and second signal levels to generate a combined signal level, unequal gains being applied to the first and second signal levels to generate the combined signal level.

26. The circuit of claim 25, wherein the stabilization circuitry comprises a clock for measuring the predetermined period of time.

27. A circuit for enabling and disabling an amplifier, the amplifier having first and second channels having first and second signal levels associated therewith, respectively, the circuit comprising:
a buffering stage for combining the first and second signal levels to generate a combined signal level, unequal gains being applied to the first and second signal levels to generate the combined signal level;
threshold circuitry for determining whether the combined signal level exceeds one or more predetermined threshold levels and indicating a signal level state for enabling or disabling an amplifier;
a gain stage for amplifying the combined signal level and generating an amplified combined signal level; and
control circuitry for enabling and disabling the amplifier in response to an amplified signal level, wherein the control circuitry comprises adjustment circuitry coupled between the threshold circuitry and the gain stage for introducing discrete signal level adjustments to the amplified signal level in opposition to a change in the amplified signal level indicated by a corresponding change in the signal level state, introduction of the signal level adjustment opposing drift in the amplified signal level.

28. The circuit of claim 27, wherein the first and second signal levels are substantially equal and of opposite phase.

29. The circuit of claim 27 further comprising:
a gain stage for amplifying the signal level and generating an amplified signal level; and
control circuitry for enabling and disabling the amplifier in response to the signal level state, the control circuitry comprising adjustment circuitry coupled between the threshold circuitry and the gain stage for introducing signal level adjustments in opposition to a change in the amplified signal level indicated by a corresponding change in the signal level state, thereby preventing enabling of the amplifier by the control circuitry where the change in the signal level state is reversed by the introduction of signal level adjustments.

30. The circuit of claim 27 further comprising:
a gain stage for amplifying the signal level and generating an amplified signal level; and
control circuitry for enabling and disabling the amplifier in response to the signal level state, the control circuitry comprising:

adjustment circuitry coupled between the threshold circuitry and the gain stage for introducing signal level adjustments in opposition to a change in the amplified signal level indicated by a corresponding change in the signal level state; and stabilization circuitry for preventing further introduction of signal level adjustments for a predetermined period of time following the introduction of a first signal level adjustment to thereby allow settling of the gain stage.

31. The circuit of claim 27 further comprising:

a gain stage for amplifying the signal level and generating an amplified signal level; and control circuitry for enabling and disabling the amplifier in response to the signal level state, the control circuitry comprising stabilization circuitry for preventing enabling of the amplifier for a predetermined period of time following disabling of the amplifier regardless of the amplified signal level.

32. A circuit for enabling and disabling an amplifier associated with a signal level, the circuit comprising:

a gain stage for amplifying the signal level;

inner threshold detectors associated with inner threshold values and coupled to the output of the gain stage, wherein the inner threshold detectors provide a signal level state representative of the amplified signal level;

control circuitry for enabling and disabling the amplifier in response to the signal level state, the control circuitry comprising adjustment circuitry coupled with the control circuitry and the gain stage, wherein the adjustment circuitry comprises a digital to analog converter for introducing signal level adjustments based on the signal level state, thereby opposing drift in the gain stage; and outer threshold detectors associated with outer threshold values, wherein the inner threshold values are bounded by the outer threshold values.

33. The circuit of claim 32, wherein the adjustment circuitry further comprises memory for storing a discrete value, the memory coupled to the input of the digital to analog converter.

34. The circuit of claim 33, wherein the discrete value remains static during predetermined intervals.

35. The circuit of claim 34, wherein adjustment circuitry is configured to prevent enabling of the amplifier by the control circuitry where the change in the signal level state is reversed by the introduction of a signal level adjustment.

36. The detector circuit of claim 34, wherein the digital to analog converter is coupled to the gain stage.

37. The circuit of claim 36, wherein the control circuitry enables the amplifier when the amplified signal level exceeds an outer threshold value.

38. A circuit for referencing an input signal comprising:

a gain stage for amplifying the input signal;

threshold circuitry for comparing the amplified signal level to one or more thresholds and indicating a signal level state representative of the amplified signal level;

adjustment circuitry for introducing discrete signal level adjustments to the amplified signal level in opposition to a change in the amplified signal level indicated by a corresponding change in the signal level state;

a first input channel associated with a first input signal level;

a second input channel associated with a second input signal level; and a buffering stage for combining the first and second signal levels to generate a combined signal level, unequal gains being applied to the first and second signal levels to generate the combined signal level.

39. The circuit of 38, wherein signal level adjustments are controlled to remain at substantially the same level for a predetermined period of time.

40. The circuit of 38, wherein the adjustment circuitry comprises a digital to analog converter.

41. The circuit of 40, wherein the adjustment circuitry further comprises a counter.

42. The circuit of 41, wherein the digital to analog converter introduces a signal level adjustment into the gain stage corresponding to the value of the counter.

43. A method for enabling or disabling an amplifier comprising:

amplifying a signal level;

comparing the amplified signal level with at least one reference level for determining a signal level state;

varying a discrete value based on the determination of the signal level state; and providing the discrete value to a digital to analog converter;

a first input channel associated with a first input signal level;

a second input channel associated with a second input signal level; and a buffering stage for combining the first and second signal levels to generate a combined signal level, unequal gains being applied to the first and second signal levels to generate the combined signal level, wherein the digital to analog converter introduces a signal level adjustment to alter the amplified signal level.

44. A circuit for enabling and disabling an amplifier, the amplifier having a signal level associated therewith, the circuit comprising:

amplification means for amplifying the signal level and generating an amplified signal level;

referencing means for comparing the amplified signal level to one or more thresholds and indicating a signal level state representative of the amplified signal level;

control means for enabling and disabling the amplifier in response to the signal level state, control means comprising adjustment means coupled between the threshold circuitry and the gain stage for introducing discrete signal level adjustments in opposition to a change in the amplified signal level indicated by a corresponding change in the signal level state, introduction of the discrete signal level opposing drift in the amplified signal level;

a first input channel associated with a first input signal level;

a second input channel associated with a second input signal level; and a buffering stage for combining the first and second signal levels to generate a combined signal level, unequal gains being applied to the first and second signal levels to generate the combined signal level.

* * * * *